(12) United States Patent
Vickers (10) Patent No.: US 8,634,578 B2
(45) Date of Patent: Jan. 21, 2014

(54) MULTIBAND DYNAMICS COMPRESSOR WITH SPECTRAL BALANCE COMPENSATION

(75) Inventor: Earl C. Vickers, Saratoga, CA (US)

(73) Assignee: STMicroelectronics, Inc., Coppell, TX (US)

( * ) Notice: Subject to any disclaimer, the term of this patent is extended or adjusted under 35 U.S.C. 154(b) by 831 days.

(21) Appl. No.: 12/821,870

(22) Filed: Jun. 23, 2010

(65) Prior Publication Data

US 2011/0320210 A1 Dec. 29, 2011

(51) Int. Cl.
*G10L 19/00* (2013.01)
(52) U.S. Cl.
USPC ... 381/94.3; 381/94.2; 381/71.11; 381/71.12; 381/104; 381/98; 381/57; 381/316; 381/317; 381/318; 381/319; 381/320; 381/321; 381/322; 381/323; 381/324; 700/94; 704/224; 704/225
(58) Field of Classification Search
USPC ........... 381/94.3, 94.2, 71.11, 71.12, 104, 98, 381/68, 316–321; 704/224–225; 700/94
See application file for complete search history.

(56) References Cited

U.S. PATENT DOCUMENTS

| | | | |
|---|---|---|---|
| 3,789,143 A * | 1/1974 | Blackmer | 381/106 |
| 4,249,042 A | 2/1981 | Orban | |
| 4,460,871 A | 7/1984 | Orban | |
| 5,677,987 A | 10/1997 | Seki et al. | |
| 6,434,246 B1 | 8/2002 | Kates et al. | |
| 6,535,846 B1 * | 3/2003 | Shashoua | 704/225 |
| 7,366,315 B2 * | 4/2008 | Blamey et al. | 381/312 |
| 7,774,201 B2 * | 8/2010 | Yamada | 704/225 |
| 7,848,531 B1 * | 12/2010 | Vickers et al. | 381/107 |
| 8,045,739 B2 * | 10/2011 | Paludan-Mueller et al. | 381/321 |
| 8,090,576 B2 * | 1/2012 | Erell | 704/225 |
| 8,204,258 B2 * | 6/2012 | Craig et al. | 381/108 |
| 2008/0004995 A1 * | 1/2008 | Klingenberg et al. | 705/28 |
| 2009/0281803 A1 * | 11/2009 | Chen et al. | 704/226 |
| 2012/0278087 A1 * | 11/2012 | Hosokawa | 704/500 |

OTHER PUBLICATIONS

Franck et al, Evaluation of spectral enhancment in hearing aids, combined with phonemic compression, JAS, 1999.*
Vickers, Earl, "The Non-Flat and Continually Changing Frequency Response of Multiband Compressors", Audio Engineering Society, Convention Paper, Presented at the 129th Convention, Nov. 4-7, 2010, San Francisco, CA, USA, pp. 1-15.
Macleod, M.D., "Nonlinear Recursive Smoothing Filters and Their Use for Noise Floor Estimation", Electronics Letters, Oct. 8, 1992, vol. 28, No. 21, pp. 1952-1953.
Moore et al., "Why are Commercials so Loud?—Perception and Modeling of the Loudness of Amplitude-Compressed Speech" J. Audio Eng. Soc., vol. 51, No. 12, Dec. 2003, pp. 1123-1132.
Lindemann, Eric, "The Continuous Frequency Dynamic Range Compressor", IEEE Xplore, Dec. 16, 2009, pp. 1-4.

(Continued)

*Primary Examiner* — Mohammad Islam
*Assistant Examiner* — Kuassi Ganmavo
(74) *Attorney, Agent, or Firm* — Gardere Wynne Sewell LLP (57) ABSTRACT

A multiband dynamics compressor implements a solution for minimizing unwanted changes to the long-term frequency response. The solution essentially proposes undoing the multiband compression in a controlled manner using much slower smoothing times. In this regard, the compensation provided acts more like an equalizer than a compressor. What is applied is a very slowly time-varying, frequency-dependent post-gain (make-up gain) that attempts to restore the smoothed long-term level of each compressor band.

24 Claims, 6 Drawing Sheets

(56) References Cited

OTHER PUBLICATIONS

Jones, Sarah, "The Big Squeeze, Mastering Engineers Debate Music's Loudness Wars", http://mixonline.com/mag/audio_big_squeeze, May 25, 2010, pp. 1-6.

Kates, James, M., "Trends in Amplification, Principles of Digital Dynamic-Range Compression" http://tia.sagepub.com/cgi/content/abstract/9/2/45, pp. 45-76.

Laroche et al., "New Phase-Vocoder Techniques for Real-Time Pitch Shifting, Chorusing, Harmonizing, and Other Exotic Audio Modifications", J. Audio Eng. Soc., vol. 47, No. 11, Nov. 1999, pp. 928-936.

Bohn, Dennis, "RaneNote, Linkwitz-Riley Crossovers: A Primer", RaneNote 160, 2005 Rane Corporation, pp. 1-14.

McNally, G.W., "Dynamic Range Control of Digital Audio Signals", J. Audio Eng. Soc., vol. 32, No. 5, May, 1984, pp. 316-327.

Vickers, Earl, "Automatic Long-Term Loudness and Dynamics Matching" Audio Engineering Society, Convention Paper 5495, Presented at the 111th Convention, Sep. 21-24, 2001, New York, NY, USA, pp. 1-11.

Foti, Frank, "Aliasing Distortion in Digital Dynamics Processing, the Cause, Effect, and Method for Measuring it: The Story of "Digital Grunge!"", Presented at the 106th Convention, May 8-11, 1999, Munich, Germany, pp. 1-10.

Linkwitz, Siegfried, H., "Active Crossover Networks for Noncoincident Drivers", Journal of the Audio Engineering Society, Jan./Feb. 1976, vol. 24, No. 1, pp. 2-8.

Horner, et al., "A Search for Best Error Metrics to Predict Discrimination of Original and Spectrally Altered Musical Instrument Sounds", J. Audio Eng., Soc., vol. 54, No. 3, Mar. 2006, pp. 140-156.

Vickers, Earl, "Frequency-Domain Multi-band Compressor", AES 129th Convention, San Francisco, CA, USA, Nov. 4-7, 2010, pp. 1-7.

Book Excerpt, Chapter 7, "Dynamic Range Control", Date Unknown, pp. 207-219.

Book Excerpt, Chapter 10, "How to Manipulate Dynamic Range for Fun and Profit, Part Two: Downward Processors", Date Unknown, pp. 119-132.

\* cited by examiner

MULTIBAND DYNAMICS COMPRESSOR WITH SPECTRAL BALANCE COMPENSATION

TECHNICAL FIELD

The present invention relates to multiband dynamic range compressors.

BACKGROUND

Dynamics compression (also known as dynamic range compression) may be used during audio mastering, broadcast or playback to adjust the gain as a function of time, in order to achieve a desired distribution of output levels. This type of compression (not to be confused with data compression algorithms such as mp3) helps keep the volume in the "sweet spot" between too soft and too loud, reducing the user's need to manually adjust (or "ride") the volume. Dynamics compression allows the quiet portions of the program to remain audible, even in a relatively noisy environment, while keeping the louder parts from becoming disturbingly loud.

Especially in the case of real-time broadcast audio, dynamics compression is the art of compromise. The system is trying to cope with input levels that may vary from one source to another, from one program to the next, or even from one moment to the next within the same program. The goal is for the quiet parts to be fully audible during low-level late night playback, without the loud parts becoming loud enough to wake sleeping housemates. Furthermore, it is desired to be able to listen in a noisy environment, such as a car or airplane, without having to choose between cranking the volume or missing the quiet parts. It is also desired to be able to watch TV without misunderstanding the dialogue, being blasted off the sofa, or constantly adjusting the volume control. Furthermore, there is a desire to tame hyper-compressed commercials that not only sound louder than uncompressed signals with the same peak level, but actually sound louder than uncompressed signals normalized to the same RMS value.

Figure 1:
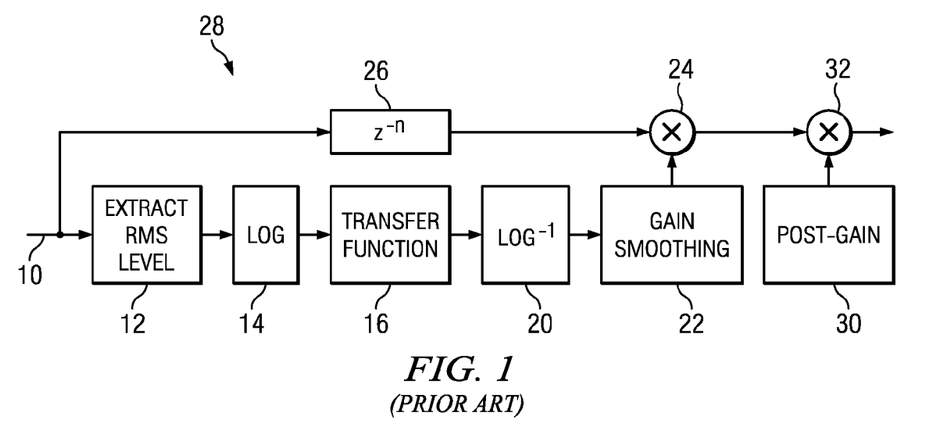
FIG. 1 is a block diagram of a typical feed-forward single-band dynamics compressor.
Figure 2A:
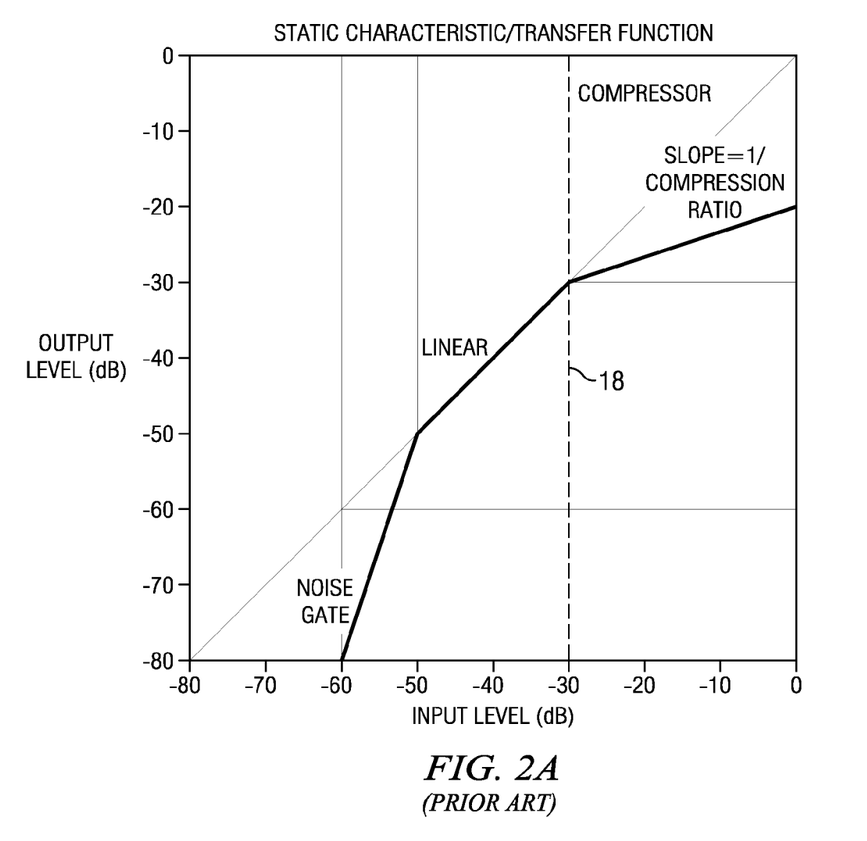
FIG. 2A shows an exemplary transfer function.
Figure 2B:
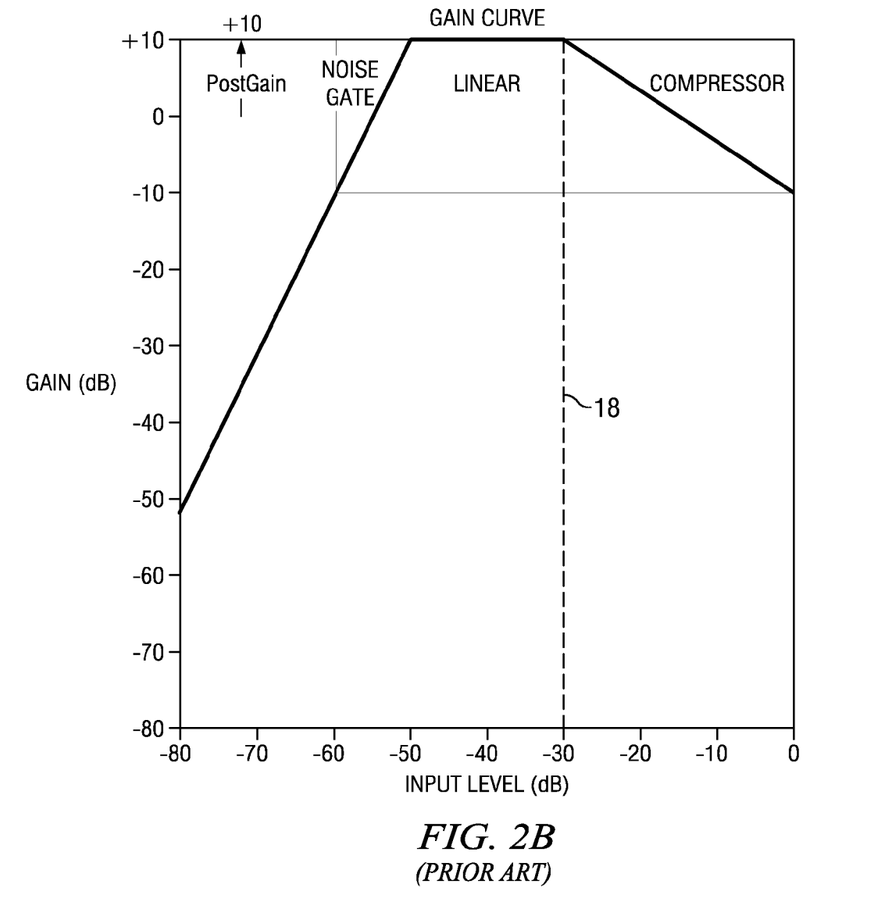
FIG. 2B shows a gain curve for the transfer function of FIG. 2A.

FIG. 1 is a block diagram of a typical feed-forward single-band dynamics compressor (C). Single-band (also known as wideband) dynamics compressors apply the same processing to the entire frequency range. The RMS level of an input signal 10 is extracted 12 and converted 14 to a logarithmic expression. Next, a transfer function (or characteristic) 16 maps the input signal level to a desired output level. FIG. 2A shows an exemplary transfer function 16. FIG. 2B illustrates the gain curve of the transfer function of FIG. 2A which results from the mapping of the input signal level to a desired output level. When the input level is less than the compression threshold 18 (−30 dB in this example), ignoring the noise gate region, each additional dB of input level produces one additional dB of output level. However, when the input level exceeds the compression threshold 18, each additional dB of input level only produces 1/r dB of additional output level, where r is the compression ratio (in FIG. 2A, r=3).

In FIG. 1, the gain is then converted 20 back from the logarithmic to a linear representation, smoothed 22 and applied 24 to a copy of the input signal 10 which has been delayed ($z^{-n}$) 26 to compensate for the delay of the gain computation path 28. Finally, some post-gain 30 may be applied 32 to help compensate for some of the gain loss due to the compression. More information on single-band dynamics compressors may be obtained from the following references (the disclosures of which are hereby incorporated by reference): G. W. McNally, "Dynamic Range Control of Digital Audio Signals," J. Audio Engineering Society, Vol. 32, No. 5, 1984 May; Udo Zölzer, Digital Audio Signal Processing, John Wiley & Sons Ltd., 1997, pp. 207-219; and Earl Vickers, "Automatic Long-term Loudness and Dynamics Matching," presented at the AES 111th Convention, New York, 2001.

Figure 3:
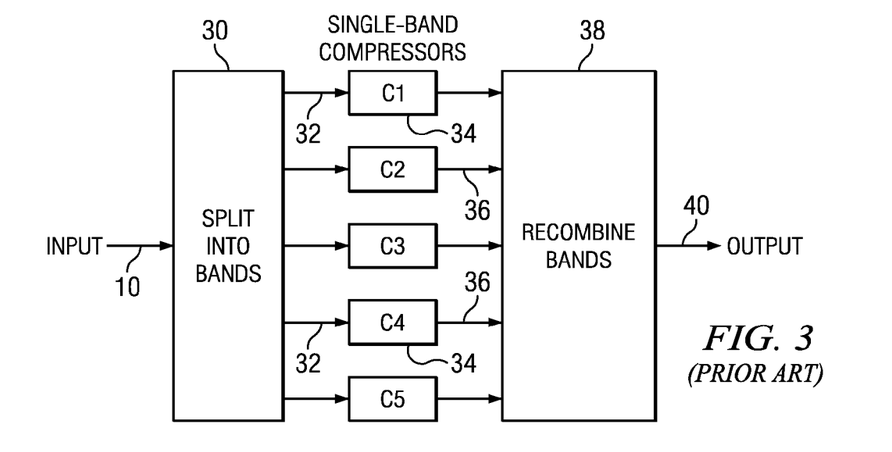
FIG. 3 is a block diagram of a typical feed-forward multi-band dynamics compressor.

A multiband dynamics compressor divides the frequency range into a plurality of frequency bands and then processes the input signal through each frequency band independently. In many implementations, a different set of processing parameters (such as compression ratios) is applied to each frequency band. FIG. 3 is a block diagram of a typical feed-forward multiband dynamics compressor. The input signal 10 is applied to a frequency band splitting block 30 which divides the signal 10 into a plurality of signals 32 each having a range of frequencies and being limited to a certain frequency band, there being some degree of frequency overlap between adjacent ones of the frequency bands. In a frequency-domain implementation, frequency band splitting block 30 may consist of a fast Fourier transform (FFT) or short-time Fourier transform (STFT), with an optional analysis window. In a time-domain implementation, frequency band splitting block 30 may consist of one or more crossover filters. Each signal 32 is then applied to one of a plurality of included feed-forward single-band compressors (C1-C5) 34. Each compressor 34 may, for example, have a configuration like that of the compressor (C) shown in FIG. 1. The output signals 36 from the plurality of compressors 34 are then combined 38 together to generate a compressed signal output 40. In a frequency-domain implementation, combining block 38 may consist of an inverse fast Fourier transform (IFFT) or inverse short-time Fourier transform (ISTFT), which may include an overlap-add implementation with optional synthesis window. In a time-domain implementation, combining block 38 may consist of a summer.

Multiband dynamics compressors are powerful, versatile tools for audio mastering, broadcast and playback. When used properly, multiband dynamics compressors have a number of advantages over single-band dynamics compressors, foremost being the fact that loud sounds in one band will not trigger artifacts such as "pumping" or "breathing" in the other bands. However, multiband dynamics compressors have a known problem relating to frequency response.

It has been noted that multiband compressors have a continually changing frequency response. The reason for this is because the included single band compressors (C1-C5) attenuate each band independently based on that band's current input energy. This compression operation may result in unwanted changes to the long-term average spectral balance. For example, the bass may be attenuated in relation to other frequencies. See, U.S. Pat. No. 4,249,042, the disclosure of which is hereby incorporated by reference.

Unlike single-band compressors, multiband compressors have the advantage that loud sounds in one frequency region will not cause attenuation ("pumping" or "breathing") at other frequencies. However, the frequency response changes over time; in fact, this is how multiband compressors do their job. The continually changing spectral response is not necessarily a problem, though it can be if the changes are too extreme. Even if the short-term frequency response changes are not objectionable in themselves, they can still result in undesirable changes to the long-term spectral balance.

For example, if the same compression threshold (for example, −20 dBFS) is used for each band, the energy in the low-frequency band(s) may consistently exceed this threshold whenever loud bass notes are played, while the threshold may rarely be exceeded in the high-frequency bands. As a result, the long-term spectral balance will be changed, because the bass will be attenuated (compressed) much more than the mid-range and treble.

The spectral centroid, or center of gravity, is closely correlated to a sound's perceptual brightness and can be used as a simple measure of the long-term spectral balance. The spectral centroid (sc) can be defined as:

$$sc = \frac{\sum_f f |X(f)|}{\sum_f |X(f)|}, \quad (1)$$

where f is the fast Fourier transform (FFT) frequency bin number and X is the complex frequency response. See, Andrew Horner, James Beauchamp, and Richard So, "A Search for Best Error Metrics to Predict Discrimination of Original and Spectrally Altered Musical Instrument Sounds," J. Audio Engineering Society, Vol. 54, Issue 3, March 2006, the disclosure of which is hereby incorporated by reference.

U.S. Pat. No. 4,249,042 teaches: "In multiband systems, since the bands operate independently, the instantaneous frequency response is seldom flat and, moreover, continually changing. Sometimes this results in pleasing sounds, but generally only in small, poor quality radios. In better audio equipment, the results of this varying frequency response produce unnatural sounds. Thus, to some extent the undesirable quality in the wideband compressor of audible modulation is traded for the problem of a shifting frequency response in the multiband systems." See, col. 1, lines 38-47.

The solution presented by U.S. Pat. No. 4,249,042 involved a three-band analog compressor in which the frequency band with the highest predictable energy (typically the mid-range band) was used as a master band to control the gain in the other (slave) bands. The compressor operated as a wideband system unless the energy in the low or high frequency bands exceeded a threshold, in which case additional attenuation was applied to the appropriate frequency band.

While this technique was intended to preserve the advantages of wideband and multiband compressors without their disadvantages, some of the problems may persist. For example, a loud mid-frequency instrument, such as a saxophone, might trigger wideband compression, causing noticeable attenuation to high-frequency instruments such as high hats when the saxophone begins to play. In addition, the low-frequency band might be attenuated separately when loud bass notes are played; this may modify the long-term average spectral balance, causing the bass to seem proportionally weaker compared to the original sound. The solution presented by U.S. Pat. No. 4,249,042 is thus not entirely satisfactory.

A need accordingly exists in the art for a spectral balance compensation that may be implemented in either the time or frequency domain. Both real-time and non-real-time processing would preferably be supported.

SUMMARY

A serious problem associated with multiband compressors is that of changes to the frequency response. Rapid spectral changes are inherent to multiband compression and can be addressed by avoiding overly aggressive parameter settings. A main concern is a side effect associated with the making of rapid (dynamic) spectral changes; namely, changes to the long-term (static) spectral balance.

The present invention proposes a multiband dynamics compressor that compensates for the difference between the long-term input and output spectra. The solution essentially undoes some of the calculated multiband compression in a calculated compensation, but uses much slower smoothing times, so that the compensation acts more like an equalizer than a compressor. The solution may be thought of as a very slowly time-varying, frequency-dependent post-gain (make-up gain) that attempts to restore the smoothed long-term level of each compressor band. The goal is to achieve the short-term benefits of multiband compression without paying the long-term spectral (im)balance cost.

In an embodiment, a multiband dynamics compressor comprises: a splitting block adapted to split a received signal into a plurality of frequency bands, each frequency band having a frequency band signal including a range of frequencies; a dynamics compressor for each frequency band adapted to compress the frequency band signal; and a combiner adapted to combine compressed signals output from the dynamics compressors to generate a compressor output signal. Each dynamics compressor comprises: a first computation block adapted to calculate, for the frequency band signal, a compressor gain value; a second computation block adapted to calculate, for the frequency band signal and in response to the calculated compressor gain value, a spectral compensation gain value; a summing circuit adapted to sum the compressor gain value and spectral compensation gain value to obtain a total gain value; and a circuit to apply the total gain value against the frequency band signal to produce the compressed signal.

In an embodiment, a method comprises: splitting a received signal into a plurality of frequency bands, each frequency band having a frequency band signal having a range of frequencies; dynamics compressing each frequency band signal; and combining compressed signals output from the dynamics compression to generate a compressor output signal. Dynamics compressing of each frequency band signal comprises: calculating, for the frequency band signal, a compressor gain value; calculating, for the frequency band signal and in response to the calculated compressor gain value, a spectral compensation gain value; summing the compressor gain value and spectral compensation gain value to obtain a total gain value; and applying the total gain value against the signals of the frequency band to produce the compressed signal.

In an embodiment, a multiband dynamics compressor comprises: a first computation block adapted to calculate, for a multiband input signal, a first long-term magnitude spectrum; a multiband dynamics compressor adapted to perform multiband dynamics compression on the multiband input signal to generate a compressed multiband output signal; a second computation block adapted to calculate, for the compressed multiband output signal, a second long-term magnitude spectrum; a summing circuit adapted to sum (with appropriate sign) the first long-term magnitude spectrum and second long-term magnitude spectrum to generate a multiband adjustment gain; and a spectral balance compensation filter adapted to filter the compressed multiband output signals in response to the multiband adjustment gain.

In an embodiment, a method comprises: first calculating, for a multiband input signal, a first long-term magnitude spectrum; multiband dynamics compressing of the multiband input signal to generate a compressed multiband output signal; second calculating, for the compressed multiband output signal, a second long-term magnitude spectrum; summing (with appropriate sign) the first long-term magnitude spectrum and second long-term magnitude spectrum to generate a multiband adjustment gain; and spectral balance compensation filtering implemented by applying the multiband adjustment gain to the compressed multiband output signal.

DETAILED DESCRIPTION OF THE DRAWINGS

At least three partially conflicting goals are recognized: 1) minimize pumping of other frequencies; 2) make the dynamic spectral changes less obvious, and 3) preserve the long-term (static) spectral balance.

Minimizing Pumping of Other Frequencies

In the short term, there is a desire to reduce the dynamic spread of the signal on a per-band basis, so that compression of one frequency band does not adversely affect the other frequency bands. The term "dynamic spread" is a generalization of the more familiar term "dynamic range". Range is one measure of the spread of a data set and is defined by only two numbers: the largest and smallest measurements. Under this definition, a massively clipped song ending in a long reverb tail that decays to one bit might be said to have full dynamic range; in this case, range tells us little of interest about this signal. A statistical measure of the dynamic spread, such as one based on the mean absolute deviation, would be much more useful and robust.

Just as multiband compressors produce fewer "pumping" side effects, whereby one musical instrument triggers gain changes to other instruments, adding additional frequency bands can further minimize the problem. As the number of frequency bands increases, the width of each frequency band decreases, and compression triggered by a component at one frequency within a frequency band will affect fewer additional components at other frequencies.

Compression that involves a single sound triggering its own attenuation is generally not as obvious, because the listener does not know how loud the sound should have been in the first place. Compression artifacts are more obvious when an ongoing "innocent bystander" sound (such as high hats or tape hiss) is suddenly attenuated because a nearby sound triggers the compressor. With narrow compressor frequency bands, "collateral damage" gain changes are less apparent because compression caused by a loud partial will affect fewer nearby partials; in addition, the nearby partials may be masked if they are within a critical frequency band.

Making Dynamic Spectral Changes Less Obvious

As mentioned, a continually changing frequency response is an inherent feature of multiband compressors. It has been noted by Katz, Mastering Audio: The Art and the Science, Boston, Mass.: Elsevier/Focal Press, 2007, the disclosure of which is incorporated by reference, that "loud action in one frequency band can dynamically change the tonality, producing an uncohesive sound especially if all the bands are moving in different amounts throughout the song." In situations where multiband spectral changes are too strong, too fast or too slow, the compression results can be quite disturbing ("watery" or even somewhat nauseating). Rather than "splitting the difference" between single-band and multiband behavior, which can cause pumping artifacts, it is instead proposed to minimize the problem with careful tuning of the compression ratios, thresholds, time constants and other parameters.

Preserving Long-Term (Static) Spectral Balance

While dynamic changes in frequency response are inevitable with multiband compressors, it is preferred to ensure that the output's long-term (static) spectral balance resembles that of the input.

This may be done by adaptively adjusting the gain of each frequency band based on a comparison of the long-term input and output spectra.

Implementations for Long-Term Spectral Balance Compensation.

Figure 4:
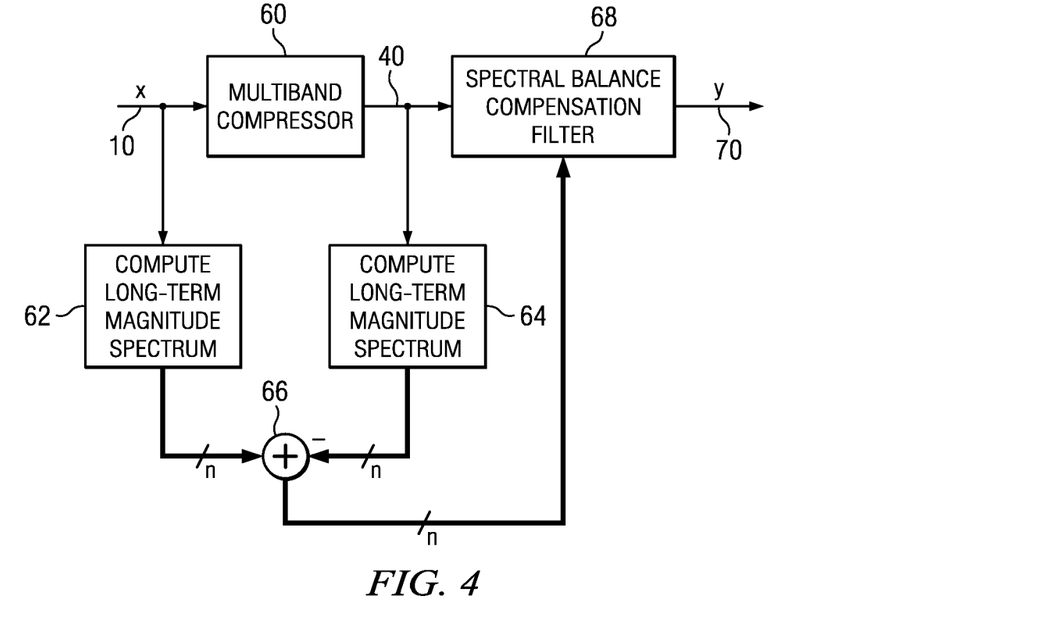
FIG. 4 is a block diagram of an implementation for non-real-time spectral balance compensation.

In a non-real-time system (for example, when mastering a CD), one solution is to analyze the input and output spectra of a signal for a given duration (for example, the signal may be an audio signal and the duration may be the length of a song or an entire album). Responsive thereto, the system applies a static equalization filter to the dynamics compressed output signal that compensates for the compressor's effect on the long-term spectral balance. An example of such an implementation is shown in FIG. 4. The input signal x 10 is received by a multiband dynamics compressor 60 which produces a compressed output signal 40. The multiband dynamics compressor 60 may comprise a compressor of the type shown, for example, in FIG. 3. The non-real-time system further comprises a first computation block 62 which computes the long-term magnitude spectrum of the input signal 10 and a second computation block 64 which computes the long-term magnitude spectrum of the compressed output signal 40. As an example, fast Fourier transform (FFT) or short-time Fourier transform (STFT) may be used in blocks 62 and 64 to generate spectral data for subsequent processing in a manner known to those skilled in the art to calculate magnitude spectra. Alternatively (for example, in a time-domain implementation), the first and second computation blocks may compute the magnitude of any number of frequency bands, which may not necessarily have equal bandwidths. A summing circuit 66 calculates a difference between the long-term magnitude spectra computed by computation blocks 62 and 64. A spectral balance compensation filter 68 responds to the calculated difference to implement the spectral balance compensation filtering (for, example, static equalization filtering) which is applied to the compressed output signal 40 in generating compensated output signal y 70. For example, if the long-term magnitude spectrum of the input signal 10, as computed by first computation block 62, is 6 dB greater than the long-term magnitude spectrum of the compressed output signal 40, as computed by second computation block 64, for a particular frequency bin or band, spectral balance compensation filter 68 may apply 6 dB of gain to the compressed output signal 40 for that frequency bin or band, in order to compensate the changes to the long-term spectral balance.

Multiband systems such as frequency-domain filterbanks using the STFT perform computations based on functions of time and frequency; therefore, such computations may be viewed as a series of vertical time slices (the "Fourier transform interpretation") or as a series of horizontal frequency bands (the "filterbank interpretation"). Therefore, these systems can be illustrated according to either interpretation.

Figure 5:
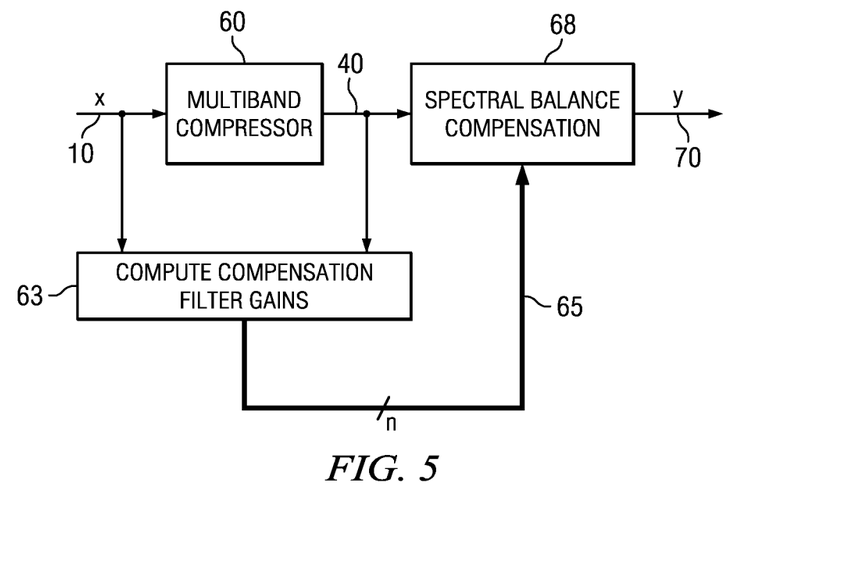
FIG. 5 is a simplified block diagram of an implementation for real-time spectral balance compensation.

Reference is now made to FIG. 5, which shows a simplified block diagram of an implementation for real-time spectral balance compensation, according to the "Fourier transform interpretation." Note, however, that this diagram applies equally well to a time-domain implementation. In FIG. 5, dynamics compression is applied to input signal x 10 by multiband compressor 60, yielding compressed signal 40. Compensation filter gain computation block 63 computes the compensation filter gains 65, based on the input signal x 10 and compressed signal 40. Spectral balance compensation block 68 applies the compensation filter gains 65 to the compressed signal 40, yielding output signal y 70.

Figure 6:
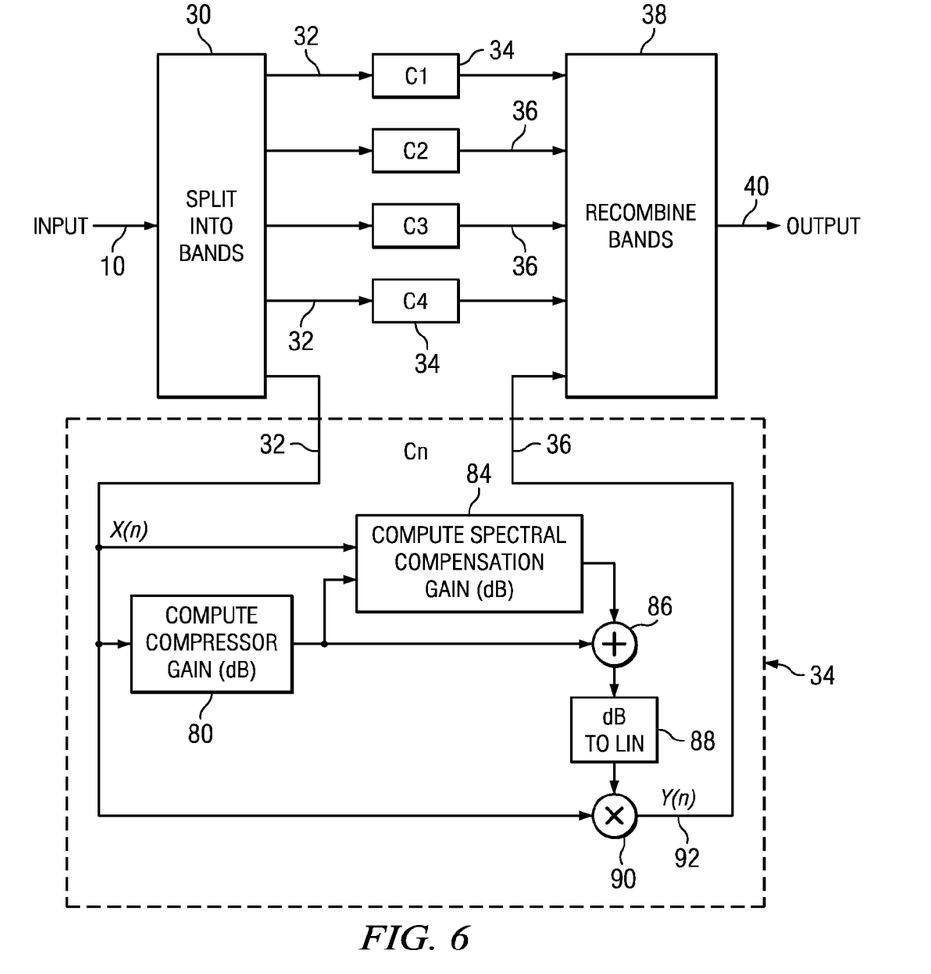
FIG. 6 is a simplified block diagram of an implementation for real-time spectral balance compensation, showing some details of one band of the computation.

Reference is now made to FIG. 6 which shows a simplified block diagram of an implementation for real-time spectral balance compensation showing some additional details of one band, n, of the computation, according to the "filterbank interpretation". The input signal 10 is applied to a frequency band splitting block 30 which divides the signal 10 into a plurality of frequency band signals 32 each including signals (such as, for example, frequency bins) being limited to a certain frequency range and optionally having some degree of frequency overlap between adjacent ones of the frequency bands. Each frequency 32 is then applied to one of a plurality of included feed-forward single-band compressors (C1-Cn) 34 (one compressor for each frequency band in this multiband compressor implementation). For each compressor frequency band, the compressor 34 executes a process to calculate and apply a gain value to that frequency band. The calculation of the gain value is generally shown with respect to compressor Cn. A compressor gain computation block 80 computes a compressor gain from the frequency band signal 32. A compensation block 84 computes spectral compensation gain from the frequency band signal 32 and the computed compressor gain output from the block 80. A summing circuit 86 sums the computed compressor gain output from the compressor gain computation block 80 with the computed spectral compensation gain output from the compensation block 84. The summed gain from the output of the summing circuit 86 is then converted 88 to a linear gain. The frequency band signal 32 is then multiplied 90 by the linear gain to generate an output signal 36.

Figure 7:
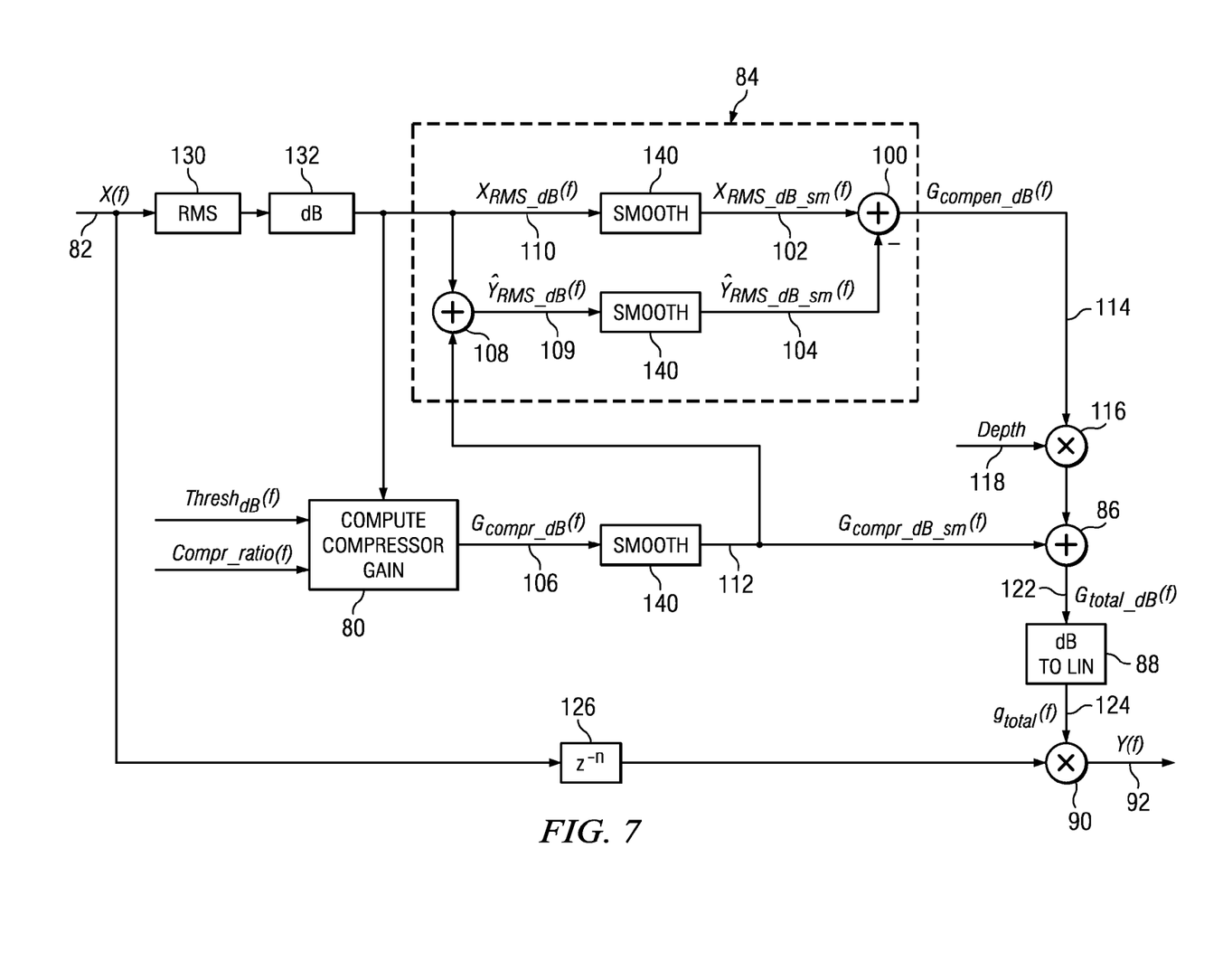
FIG. 7 is a more detailed block diagram of the implementation for real-time spectral balance compensation shown in FIG. 6.

Reference is now made to FIG. 7 which shows a more detailed block diagram of the implementation for a single band f for the real-time spectral balance compensation shown in FIG. 6.

For each frequency band f, the compensation block 84 computes a very slowly changing spectral balance compensation gain $G_{compen\_dB}(f)$ which is updated at each STFT frame (for a frequency-domain implementation) or at intervals of one or more samples (for a time-domain implementation). The time indices have been omitted herein for clarity. The RMS level of the input signal X(f) 82 is extracted 130 and converted 132 to a logarithmic representation as the input RMS level $X_{RMS\_dB}(f)$ 110 signal.

The spectral balance compensation gain $G_{compen\_dB}(f)$ 114 is calculated by the spectral compensation block 84 as the difference 100 in dB between a frequency band's smoothed input RMS level $X_{RMS\_dB\_sm}(f)$ 102 and a smoothed estimate $\hat{Y}_{RMS\_dB\_sm}(f)$ 104 of its uncompensated output level. In other words, the compensation gains are computed based on the difference between the long-term input and output magnitude spectra. By matching the long-term input and output RMS levels in each band, the long-term spectral balance is being compensated.

Uncompensated output estimate $\hat{Y}_{RMS\_dB}(f)$ 109 is computed as the sum 108 of the input RMS level $X_{RMS\_dB}(f)$ 110 and the smoothed compressor gain $G_{compr\_dB\_sm}(f)$ 112. (The estimate is used to save the cost of converting the previous actual time-domain output signal back to the frequency domain, computing the RMS values, converting to dB, and subtracting the previous compensation gain.) The smoothed uncompensated output estimate $\hat{Y}_{RMS\_dB\_sm}(f)$ 104 is computed by smoothing the uncompensated output estimate $\hat{Y}_{RMS\_dB}(f)$ 109. The compressor gain $G_{compr\_dB}(f)$ 106 is calculated by the compressor gain computation block 80 from the input RMS level $X_{RMS\_dB}(f)$ 110 and the settings for the threshold ($Thresh_{dB}(f)$) and compression ratio (Compr_ratio (f)) in a manner well known to those skilled in the art. The output compensation gain $G_{compen\_dB}(f)$ 114 is scaled 116 by a Depth parameter 118 (0 to 100%) and added 86 to the smoothed compressor gain $G_{compr\_dB\_sm}(f)$ 112 to yield a total dB gain $g_{tota\_db}(f)$ 122, which is converted 88 back to a linear gain $g_{total}(f)$ 124. The Depth parameter 118 allows for the implementation of partial compensation, if desired, the benefits of which are described in more detail below. The input signal X(f) 82 (optionally delayed 126) is then multiplied 90 by the linear gain $g_{total}(f)$ 124 to yield the frequency band's output signal Y(f) 92.

The input RMS level $X_{RMS\_dB}(f)$ 110, the uncompensated output estimate $\hat{Y}_{RMS\_dB}(f)$ 109 and compressor gain $G_{compr\_dB}(f)$ 106 can be smoothed by smoothing circuits 140 in various ways, including the use of non-linear recursive smoothing, exponential smoothing, or moving-average filtering. Non-linear recursive smoothing is inexpensive and may be preferable for this application as the output tends to approximate the median of the input without over-emphasizing the most recent inputs as is the case with an exponential smoothing filter. The non-linear recursive smoothing filter is a first-order difference-clipper; it is identical to analysis-by-synthesis differential pulse-code modulation (DPCM), but is used to implement slew-rate-limited smoothing instead of encoding. The non-linear recursive smoothing filter is, however, modified slightly from conventional implementations so as to support the use of unequal attack and release coefficients, in order to provide more emphasis to the louder segments. Given an input x(t), the output is:

$$y(t) = \begin{cases} y(t-1) + \lambda_a \mathrm{sgn}(x(t) - y(t-1)), & x(t) \geq y(t-1) \\ y(t-1) + \lambda_r \mathrm{sgn}(x(t) - y(t-1)), & x(t) < y(t-1), \end{cases} \quad (2)$$

where $\lambda_a$ and $\lambda_r$ are the attack and release coefficients, respectively.

Figure 8:
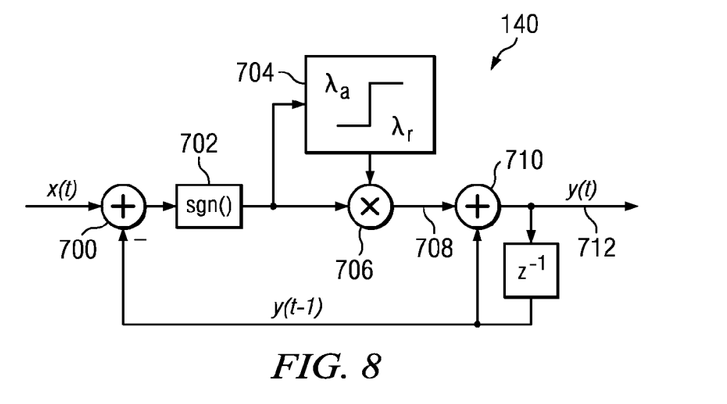
FIG. 8 is a block diagram of a modified non-linear recursive smoothing filter used in the implementation of FIG. 7.

Reference is now made to FIG. 8 which shows a block diagram of a modified non-linear recursive smoothing filter 140 used in the implementation of FIG. 7. Difference operation 700 computes the difference between the current input value, x(t), and the previous output value, y(t−1), yielding a difference signal x(t)−y(t−1). The sign block 702 computes the sign of the difference signal. If the difference signal is greater than or equal to zero, the hysteresis block 704 will select attack coefficient $\lambda_a$; otherwise, it will select release coefficient $\lambda_r$. Multiplier 706 then multiplies the sign of the difference signal by the selected coefficient, yielding a product 708. The product 708 is then added 710 to the previous output value, y(t−1), yielding the new output value 712, y(t). The result is that, so long as the input is greater than the output, the output will increment at a slew rate determined by the attack coefficient $X_a$; as long as the input is smaller than the output, the output will decrement at a slew rate determined by the release coefficient $\lambda_r$.

Regardless of the smoothing method used, unequal attack and release rates (or coefficients) are preferably supported. The combination of a medium-to-fast attack rate and a very slow release rate is preferred. To some extent, the difference between the attack and release rates will skew the input and output spectral balance estimates toward the spectra of the louder parts of the sound, since the estimates will ramp rapidly toward a loud peak but decay slowly from there. If desired, the attack and release rates can be fine-tuned based on measurements of the smoothed spectral centroids of the input and output signals (see Equation 1, above).

Except for differences due to the asymmetrical attack and release rates, the compensation gain is closely related to the negative of the compression gain, with additional smoothing. In other words, the compensation gain may be seen as partially undoing the multiband compression operation, but this is occurring with much slower time constants.

Any compensation of the long-term spectral balance must be slow enough that it does not simply undo what the compressor was trying to do in the first place. In addition, it is undesirable for the spectral balance compensation to draw attention to itself. Therefore, the time-scale of the compensation should be significantly slower than that of the compression itself.

On a short (microdynamic, note-to-note) time-scale, on the order of milliseconds, the compressor will respond normally to note onsets by applying gain reduction as needed. On a much longer (macrodynamic) time-scale, from around thirty seconds to five minutes, the compressor will slowly compensate for changes to the long-term spectral balance. As the time constants grow longer, the spectral balance compensation begins to resemble a fixed EQ filter.

Figure 9:
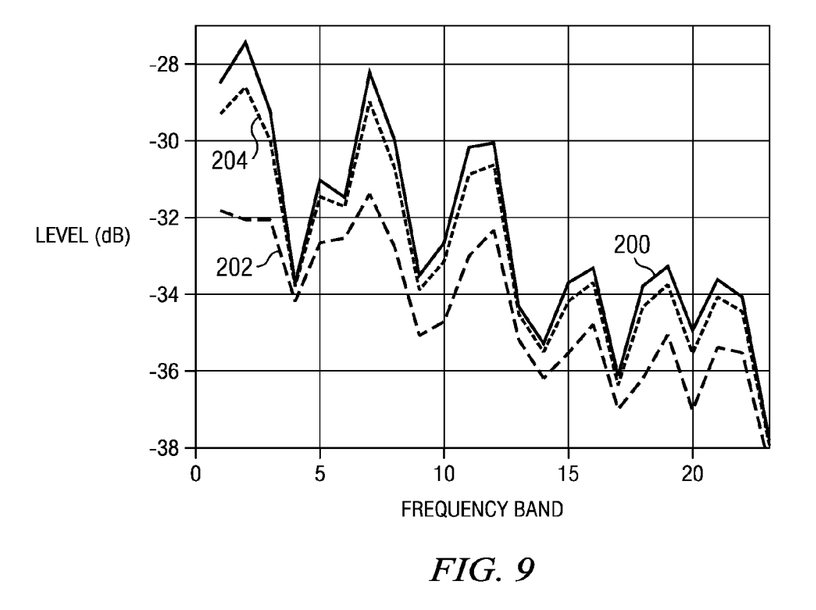
FIG. 9 is a graph illustrating the operation of the implementation of FIGS. 6-8 for spectral balance compensation at one frame.

Reference is now made to FIG. 9 which is a graph illustrating the operation of the implementation of FIGS. 6-8 for spectral balance compensation at one frame. The solid line 200 shows the smoothed input RMS level for each compressor band. This is a snapshot of the running estimate of the input signal's long-term spectral balance at a given moment in time. The dashed line 202 shows the estimated long-term spectral balance of the compressed signal, with no compensation. Finally, the dotted line 204 shows the estimated long-term spectral balance with partial compensation (Depth=75%) having been applied. It will be noted that the spectral balance of the result with line 204 more closely resembles that of the input and line 200. FIG. 9 shows that the long-term spectral balance of the compensated output is closer to that of the input than it is to that of the uncompensated output.

Dynamics compression often increases the salience of reverb because it tends to reduce the gain of a loud, direct-path sound more than it does that of the associated, lower-level reflections and reverberation. If the spectral balance compensation then boosts the bands that have been compressed, in an attempt to restore the long-term spectral balance, the increased reverberation may become more noticeable. This may also amplify low-level noise.

Figure 10:
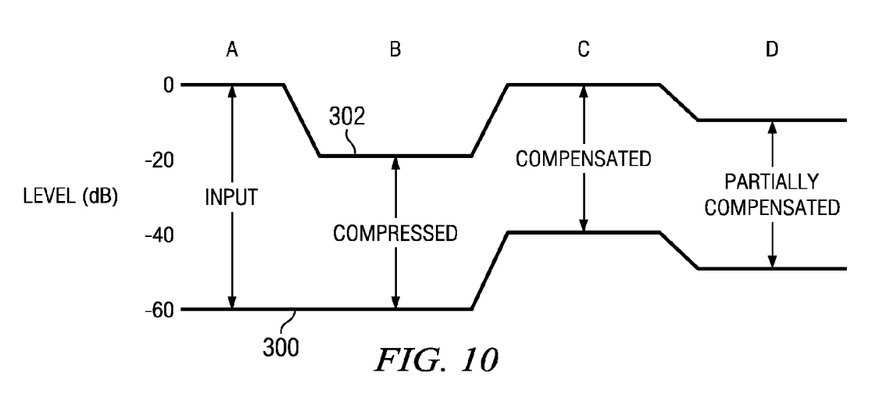
FIG. 10 depicts the dynamic range for a single compressor frequency band, using four possible scenarios.

This situation is illustrated in FIG. 10 which depicts the dynamic range for a single compressor frequency band, using four possible scenarios. (The phrase "dynamic range" is used here instead of "dynamic spread," as previously mentioned, for simplicity of explanation.) The lower arrows point to the level 300 of the quietest frame of the recording, for this frequency band, while the upper arrows point to the level 302 of the loudest frame. It is assumed that this frequency band contains the loudest instrument in the recording (e.g., saxophone) and therefore needs to be compressed.

Section "A" of FIG. 10 shows the scenario for the range of the input for this frequency band. Section "B" shows scenario for the reduced dynamic range for this frequency band after compression has been performed. The long-term spectral balance has now been modified, since this frequency band has been attenuated relative to other frequency bands, which may have been below the compression threshold. Therefore, compensation, as shown in the scenario for section "C" of FIG. 10, is applied by adding a (very slowly-changing) gain to this band to restore its original long-term level. Unfortunately, this may in fact over-compensate, because the long-term RMS estimates are skewed toward the louder parts of the sound due to the difference between the attack and release rates, as mentioned previously. This results in a significant increase at the lower end of the range, which may make reverberation and low-level noise more noticeable. As a compromise, the Depth parameter is used to apply only partial compensation, as shown in the scenario for section "D" of FIG. 10. The goal is to minimize changes to the original spectral balance while avoiding adding excessive reverberation and noise.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A multiband dynamics compressor, comprising:
a splitting block adapted to split a received signal into a plurality of frequency bands, each frequency band having a frequency band signal including a range of frequencies;
a dynamics compressor for each frequency band adapted to compress the frequency band signal; and
a combiner adapted to combine compressed signals output from the dynamics compressors to generate a compressor output signal;
wherein each dynamics compressor comprises:
a first computation block adapted to calculate, for the frequency band signal, a compressor gain value;
a second computation block adapted to calculate, for the frequency band signal and in response to the calculated compressor gain value, a spectral compensation gain value equal to a difference between the received frequency band signal and an estimate of an uncompensated frequency band signal compressed in accordance with the compressor gain value;
a summing circuit adapted to sum the compressor gain value and spectral compensation gain value to obtain a total gain value; and
a circuit to apply the total gain value against the frequency band signal to produce the compressed signal.

2. The compressor of claim 1, wherein the splitting block comprises a fast Fourier transform (FFT) for processing the received signal to generate the plurality of frequency band signals.

3. The compressor of claim 1, wherein the splitting block comprises a short-time Fourier transform (STFT) for processing the received signal to generate the plurality of frequency band signals.

4. The compressor of claim 1, wherein the splitting block comprises a plurality of cross-over filters for processing the received signal to generate the plurality of frequency band signals.

5. The compressor of claim 1, further comprising a scaling circuit adapted to scale the spectral compensation gain value prior to the summing circuit.

6. The compressor of claim 1, wherein the second computation block comprises:
a summer circuit configured to sum the compressor gain value with the frequency band signal to generate the estimate of the uncompensated frequency band signal; and
a subtraction circuit configured to subtract the estimate of the uncompensated frequency band signal from the frequency band signal to generate the spectral compensation gain value.

7. The compressor of claim 6, further comprising: a smoothing circuit configured to smooth the frequency band signal prior to subtracting and a smoothing circuit configured to smooth the estimate of the uncompensated frequency band signal prior to subtracting.

8. The compressor of claim 6, further comprising a smoothing circuit configured to smooth the compressor gain value prior to summing.

9. A multiband dynamics compressor, comprising:
a splitting block adapted to split a received signal into a plurality of frequency bands, each frequency band having a frequency band signal including a range of frequencies;
a dynamics compressor for each frequency band adapted to compress the frequency band signal; and
a combiner adapted to combine compressed signals output from the dynamics compressors to generate a compressor output signal;
wherein each dynamics compressor comprises:
a first computation block adapted to calculate, for the frequency band signal, a compressor gain value;
a second computation block adapted to calculate, for the frequency band signal and in response to the calculated compressor gain value, a spectral compensation gain value;
a summing circuit adapted to sum the compressor gain value and spectral compensation gain value to obtain a total gain value; and
a circuit to apply the total gain value against the frequency band signal to produce the compressed signal;
wherein the second computation block comprises:
a first smoothing circuit adapted to smooth a first signal derived from the frequency band signal and generate a first output;
a first summing circuit adapted to sum the compressor gain value with the first signal and generate a second output;
a second smoothing circuit adapted to smooth the second output and generate a third output; and
a second summing circuit adapted to sum the first output and the third output to generate the spectral compensation gain value.

10. The compressor of claim 9, further comprising a third smoothing circuit adapted to smooth the compressor gain value prior to be summed by the first summing circuit.

11. The compressor of claim 9, wherein the smoothing circuits comprise a non-linear recursive smoothing filter.

12. The compressor of claim 11, wherein the non-linear recursive smoothing filter supports the use of unequal attack and release coefficients.

13. A method, comprising:
splitting a received signal into a plurality of frequency bands, each frequency band having a frequency band signal having a range of frequencies;
dynamics compressing each frequency band signal; and
combining compressed signals output from the dynamics compression to generate a compressor output signal;
wherein dynamics compressing of each frequency band signal comprises:
calculating, for the frequency band signal, a compressor gain value;
calculating, for the frequency band signal and in response to the calculated compressor gain value, a spectral compensation gain value equal to a difference between the received frequency band signal and an estimate of an uncompensated frequency band signal compressed in accordance with the compressor gain value;
summing the compressor gain value and spectral compensation gain value to obtain a total gain value; and
applying the total gain value against the signals of the frequency band to produce the compressed signal.

14. The method of claim 13, wherein splitting comprises performing a fast Fourier transform (FFT) for processing the received signal to generate the frequency band signals.

15. The method of claim 13, wherein splitting comprises performing a short-time Fourier transform (STFT) for processing the received signal to generate the frequency band signals.

16. The method of claim 13, wherein splitting comprises performing crossover filtering for processing the received signal to generate the frequency band signals.

17. The method of claim 13, further comprising scaling the spectral compensation gain value prior to summing.

18. The method of claim 13, wherein calculating the spectral compensation gain value comprises:
summing the compressor gain value with the frequency band signal to generate the estimate of the uncompensated frequency band signal; and
subtracting the estimate of the uncompensated frequency band signal from the frequency band signal to generate the spectral compensation gain value.

19. The method of claim 18, further comprising: smoothing the frequency band signal prior to subtracting and smoothing the estimate of the uncompensated frequency band signal prior to subtracting.

20. The method of claim 18, further comprising smoothing the compressor gain value prior to summing.

21. A method, comprising:
splitting a received signal into a plurality of frequency bands, each frequency band having a frequency band signal having a range of frequencies;
dynamics compressing each frequency band signal; and
combining compressed signals output from the dynamics compression to generate a compressor output signal;
wherein dynamics compressing of each frequency band signal comprises:
calculating, for the frequency band signal, a compressor gain value;
calculating, for the frequency band signal and in response to the calculated compressor gain value, a spectral compensation gain value;

summing the compressor gain value and spectral compensation gain value to obtain a total gain value; and applying the total gain value against the signals of the frequency band to produce the compressed signal;

wherein calculating the spectral compensation gain value comprises:

first smoothing a first signal derived from the frequency band signal to generate a first output;

first summing the compressor gain value with the first signal to generate a second output;

second smoothing the second output to generate a third output; and second summing the first output and the third output to generate the spectral compensation gain value.

22. The method of claim 21, further comprising third smoothing the compressor gain value prior to the first summing.

23. The method of claim 21, wherein smoothing comprises implementing non-linear recursive smoothing filtering.

24. The method of claim 23, wherein non-linear recursive smoothing filtering supports the use of unequal attack and release coefficients.

* * * * *